United States Patent [19]

Schowe, Jr.

[11] 4,296,445

[45] Oct. 20, 1981

[54] PHASE SENSOR

[75] Inventor: Lester F. Schowe, Jr., Morrison, Colo.

[73] Assignee: Honeywell, Inc., Minneapolis, Minn.

[21] Appl. No.: 139,257

[22] Filed: Apr. 11, 1980

[51] Int. Cl.³ .......................... G11B 5/45; G11B 5/09
[52] U.S. Cl. ...................................... 360/65; 360/46
[58] Field of Search ............................. 360/31, 46, 65

[56] References Cited

U.S. PATENT DOCUMENTS

| | | | |
|---|---|---|---|
| 3,436,490 | 4/1969 | Roelots | 360/65 |
| 3,864,734 | 2/1975 | Gish | 360/46 |
| 4,244,008 | 1/1981 | Holt | 360/65 |

*Primary Examiner*—Vincent P. Canney
*Attorney, Agent, or Firm*—L. J. Marhoefer; Lockwood D. Burton

[57] ABSTRACT

In a magnetic tape recording/playback system, there has here been provided a phase sensor circuit wherein a recorded square wave signal, when played back, produces a signal which includes a predominant first and third harmonic. A filtered sample of the relative amplitude of the resulting peaks is compared and a difference signal is indicative of a phase shift error. That signal may then be used to effect a control to correct the phase shift error.

8 Claims, 3 Drawing Figures

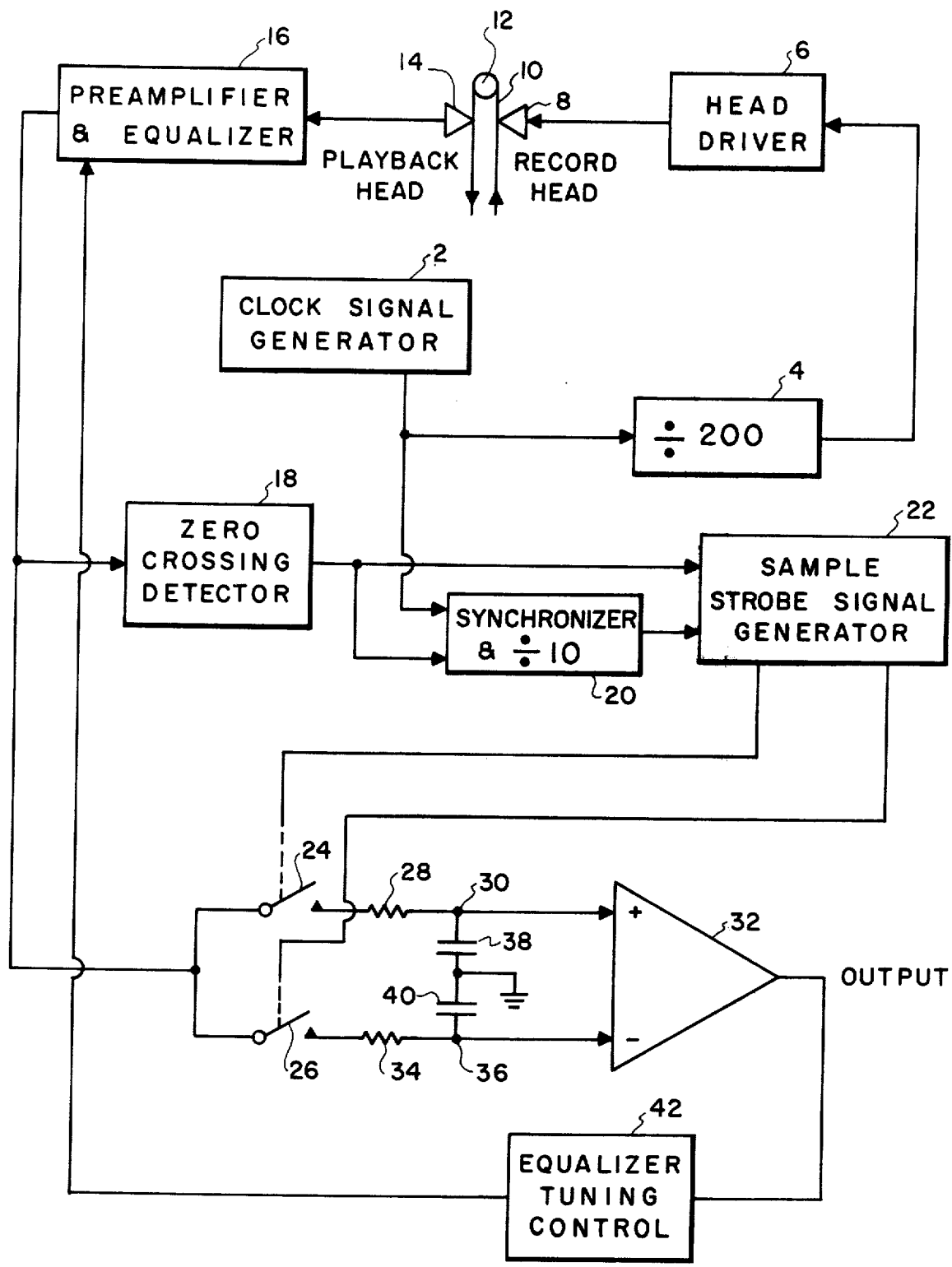
F I G. 2

PHASE SENSOR

BACKGROUND OF THE INVENTION

The present invention relates to magnetic recording-playback apparatus. More particularly, it relates to phase sensor means and method for a playback circuit calibrating means.

In the art of high performance magnetic tape recording, in the playback of recorded signals, there is a characteristic 6db per octave rise in the response of the system, up to a peak at a predetermined frequency, then a drop off of the response. Since that calibration is undesirable in the playback, means have been provided for compensating for that rise and fall characteristic by circuits known as equalizers. These equalizers, together with the preamplifier associated with the playback transducers, or heads, produce a response curve which is relatively flat from a predetermined minimum frequency to a predetermined maximum frequency known as "bandedge". At the bandedge frequency, there is a sharp decrease or rolloff in the response. The equalizers, in association with the playback heads, and, to some extent, the preamplifier, introduce a phase shift distortion which is particularly undesirable in digital recording systems. The phase shift distortion is eliminated or minimized by properly tuning the equalizer with the playback head and its preamplifier.

A square wave signal of a frequency equal to one third of the bandedge frequency has been recorded on the tape, then, on playback the resultant waveshape will be a wave with two peaks representative of the resultant of the first and third harmonic of the recorded frequency. That waveshape is viewed on an oscilloscope and the equalizer tuned to make the two peaks equal in amplitude.

It has now become desirable to include the tuning of the equalizer as a part of an automatic calibration system for such tape systems, wherein the calibration is accomplished by means of a microprocessor. When the equalizer is not properly tuned, either the first peak or the second peak will be higher in amplitude than the other. A difficulty that has been encountered is the absence of a suitable means for determining or measuring the relative amplitude of the two harmonic peaks as a measure of the tuning of the equalizer. Conventional sample and hold circuits were considered to be not suitable because the inescapable jitter in the tape causes the signal to be unstable to the point of uselessness.

SUMMARY OF THE INVENTION

It is, accordingly, an object of the present invention to provide an improved phase sensor circuit.

It is another object of the present invention to provide a phase sensor circuit for use in tape recorder/reproducer systems.

It is a further object of the present invention to provide means for establishing a stable accurate phase responsive signal.

It is yet a further object of the present invention to provide an improved method of sensing a phase error.

In accomplishing these and other objects, there has been provided, in accordance with the present invention, a phase sensor circuit wherein a recorded square wave signal, when played back, includes a predominant first and third harmonic. A filtered sample of the relative amplitude of the harmonic peaks is compared and a difference signal is indicative of a phase shift error in the reproducing system. That signal may then be used to effect a control to correct the phase shift error.

BRIEF DESCRIPTION OF THE DRAWINGS

A better understanding of the present invention may be had from the following detailed description when read in the light of the accompanying drawings, in which:

FIG. 2 is a block diagram illustrating an embodiment of the present invention.

DETAILED DESCRIPTION

Figure 1:
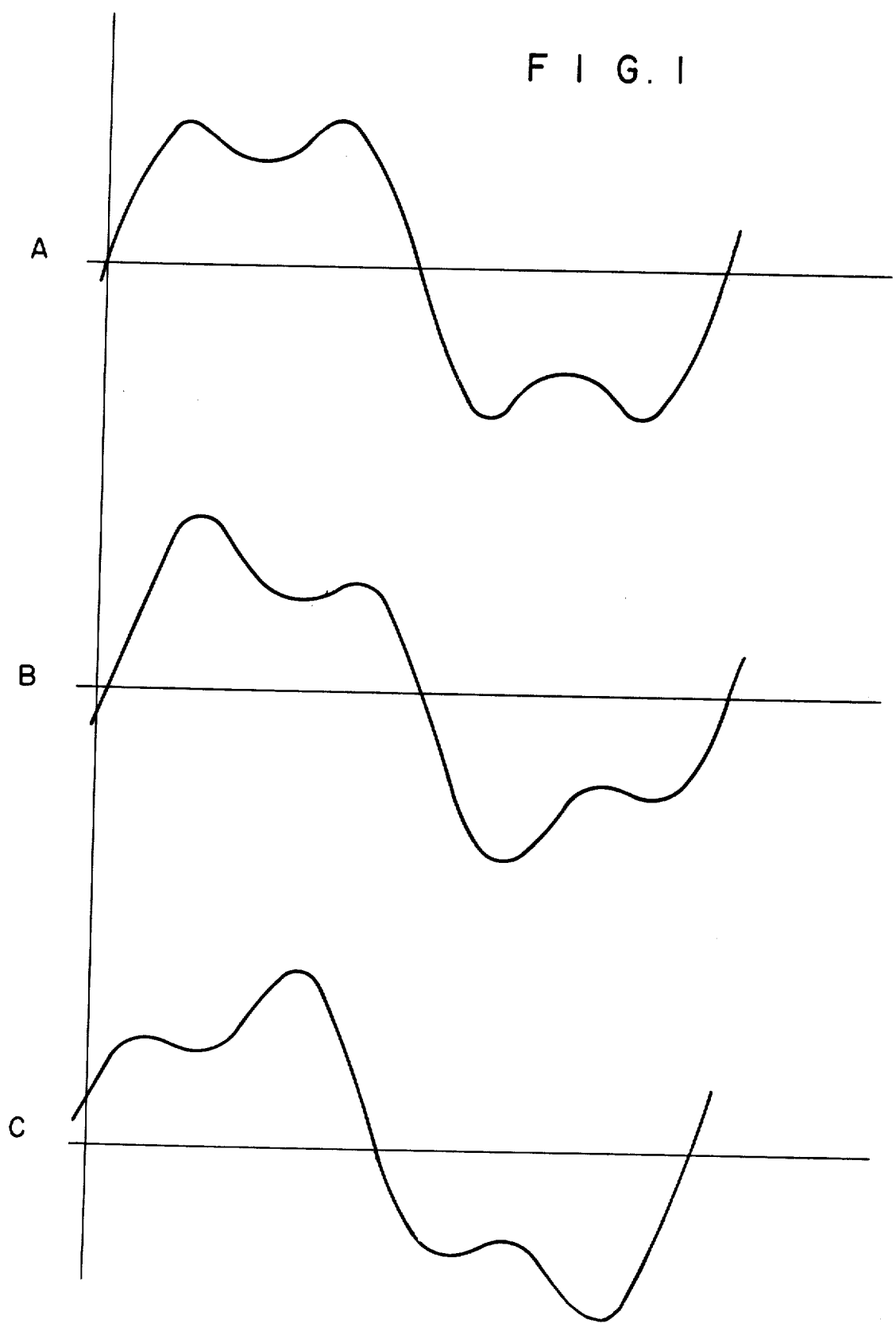
FIG. 1 is a set of curves helpful in understanding the present invention.

Referring now to the drawings in more detail, there is shown in FIG. 1 a curve A which is representative of the playback of a square wave signal in a system wherein the equalizer is properly tuned. In this wave shape it may be seen that the double peaks representing resultant of the first and third harmonics of the recorded frequency signal are equal in amplitude. The higher order harmonics will be frequencies which fall beyond the bandedge frequency of the system and thus will not be significantly present in the playback signal. In curve B of FIG. 1 it may be seen that the two peaks of the waveform are of unequal amplitude with the first peak being greater than the second peak. This indicates that the third harmonic signal is lagging the first harmonic. In curve C of FIG. 1 the waveshape is such that the two peaks are of unequal amplitude with the second peak being of greater magnitude than the first peak. This indicates that the third harmonic signal is leading in phase with respect to the first harmonic. As will be seen hereinafter, it is the difference in the amplitude of the two peaks which will be sensed as an indication of the phase relationship of the first and third harmoncis in the playback system.

To this end, there is shown in FIG. 2 a block diagram of an embodiment of the present invention for obtaining a signal representative of the phase relationship of the signal obtained from the tape recorder. A clock signal generator 2 produces a signal which, in an exemplary embodiment, had a frequency of 66.667 times the bandedge frequency of the tape recorder system. The output of the clock signal generator 2 is connected to the input of a frequency divider 4. If that frequency divider 4 is arranged to be a divide-by-200 circuit, then the output signal from the divider 4 will be one third the frequency of the bandedge frequency of the tape recorder system. That signal is represented in curve A of FIG. 3 and is applied to the input of a head driver circuit 6 of the tape recorder. The output of the head driver circuit 6 is connected to a recording head, or transducer, 8 which records the signal on a magentic record tape 10. The tape 10 is driven by apparatus not shown herein about an idler roller 12, thence past a playback head 14.

The signals generated in the playback head are applied as input signals to a preamplifier and equalizer circuit 16. The output of the equalizer circuits 16 is in the form of the waveshapes shown in FIG. 1 and at curve B of FIG. 3. The output of the preamplifer and equalizer circuit 16 is connected to the input of a zero crossing detector 18. The zero crossing detector 18 produces an output pulse on each positive going crossing of the zero axis by the waveform of curve B of FIG. 3. This output pulse is shown in curve C of FIG. 3.

The output of the zero crossing detector 18 is connected to a control input of a synchronizer and frequency divider circuit 20. In the aforementioned exemplary embodiment of the present invention, the frequency divider circuit 20 was in the form of a decade counter providing a divide-by-10 function. In that case, the signal from the zero crossing detector was applied to the CLEAR input terminal of the counter. The output of the clock signal generator 2 is connected to the CLOCK input of the counter 20. Since the clock signal from the generator 2, in the exemplary embodiment, is 66.667 times the bandedge frequency, the output of the counter 20 will be 6.667 times the bandedge frequency. This signal is illustrated at curve D of FIG. 3. That signal is applied as an input signal to a sample strobe signal generator 22. Again, in the exemplary embodiment, the sample strobe signal generator was in the form of a shift register. The output signal from the counter 20 was applied to the CLOCK input terminal of the shift register 22. The output pulse from the zero crossing detector 18 was also applied to the CLEAR input terminal of the sample strobe signal generator 22. The generator 22 is arranged to produce two strobe pulses as shown at lines E and F of FIG. 3. The shift register 22 is also synchronized by the output pulse from the zero crossing detector 18 and clocked by the output pulses from the frequency divider 20. Thus the width of each of the output pulses from the generator 22 is equal to one-twentieth of the equalizer waveform. The time delay introduced by the shift register or strobe signal generator 22 is such that the center of each of the two pulses is precisely coincident with the occurrence of the respective two peaks of the positive portion of the equalizer output waveform.

The output of the preamplifier and equalizer 16 is also applied simultaneously to one terminal of each of two switch members 24 and 26, respectively. These switches 24 and 26 may be and preferably are electronic analog switch members. The second terminal of the switch 24 is connected through a resistor 28 to a junction 30, thence to the non-inverting input of a differential amplifier 32. The second terminal of the switch 26 is connected through a resistor 34 to a junction 36, thence to the inverting input terminal of the differential amplifier 32. The junction 30 is connected through a capacitor 38 to ground. The junction 36 is similarly connected through a capacitor 40 to ground. The switch 24 is acutated by the first sample strobe signal from the generator 22 during an interval corresponding to the pulse shown in curve E of FIG. 3. The switch 26 is actuated by the second sample strobe signal from the generator 22 during an interval corresponding to the pulse of curve F of FIG. 3. The capacitor 38 and the resistor 28 comprise a filtered storage for the signals transmitted from the preamplifier and equalizer 16 during the interval of the closure of the switch 24. Similarly, the capacitor 40 and the resistor 34 comprise a filtered storage for the signals transmitted from the preamplifier and equalizer 16 through the closure of the switch 26. Each RC network sees either an open circuit or the portion of the equalizer output waveform specified by the respective pulse. Since the width of the sample pulses are each one twentieth of the period defined by the zero crossing detector, this results in the sampled portion of the waveform being filtered with a time constant of $20 \times R \times C$. The DC component of the sampled signal will appear across the respective capacitors 38 and 40. In the aforementioned exemplary embodiment, the time constant of each of the two filters was approximately 20 milliseconds.

Figure 3:
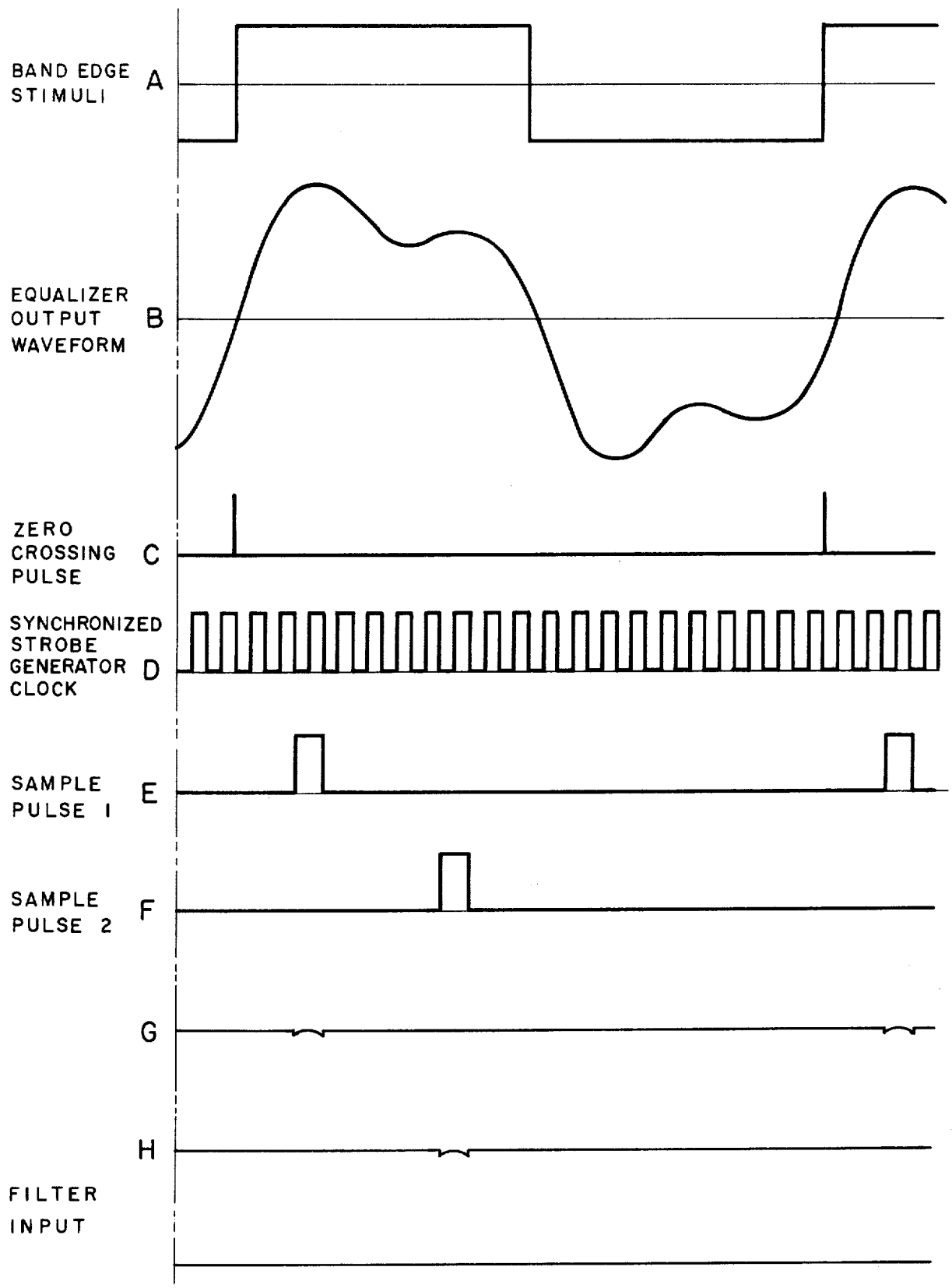
FIG. 3 is a set of waveforms helpful in understanding the operation of the present invention.

With the unbalanced waveform such as shown in curve B of FIGS. 1 and 3, the potential of the signal appearing at the second terminal of the switch 24 will be a substantially constant value illustrated by the curve G of FIG. 3 wherein a slight disturbance occurs at the opening and closing of the switch 24. This substantially constant value represents the time-average of the amplitude of the first peaks of the waveform shown in curve B. The potential of the signal appearing at the second terminal of the switch 26 will be substantially constant value somewhat less than the potential of the signal appearing at the second terminal of the switch 24 and again with a slight disturbance during the interval of the opening and closing of the switch 26. This potential is illustrated by the curve H of FIG. 3 and represents the time-average of the amplitude of the second peaks of the waveform shown in curve B. The DC components of these signals is applied to the two input terminals of the differential amplifier 32. The output signal of the differential amplifier 32 is a direct function of the difference between the magnitude of the two signals applied to the input terminals thereof. In the case of the waveform illustrated in curve B of FIGS. 1 and 3, the output signal from the differential amplifer 32 will be a positive signal of a value commensurate with the difference in the magnitude of the two input signals thereto. If, on other hand, the input signals to the differential amplifier had been derived from an output waveform from the equalizer corresponding to the waveform of curve C of FIG. 1, the output signal from the differential amplifier would be a negative signal again with a magnitude commensurate with the difference in magnitude of the two applied signals. If the signals applied to the input of the differential amplifier were derived from a balanced waveform such as is shown in curve A of FIG. 1, the output of the differential amplifier 32 would be substantially zero. It will be noted that the time-average filtering of the sampled signals eliminates the adverse effect of jitter in the tape motion.

The output signal from the differential amplifier is applied to the input of an equalizer tuning control circuit 42. The output of the equalizer tuning control circuit 42 is applied to adjust the tuning of the equalizer 16 whereby to effect a balanced curve such as shown in curve A of FIG. 1. As noted hereinbefore, such a balanced curve is indicative of the proper tuning of the equalizer to eliminate the phase shift distortion from the system. The equalizer tuning control circuit 42 does not form a part of the present invention. Any number of different types of apparatus may be used to satisfy the requirements of the equalizer tuning control circuit, such, for example, as a signal responsive servo system, such systems being well-known in the art.

Thus, there has been provided, in accordance with the present invention, means for developing a phase distortion responsive signal which may be utilized in a tape recorder playback system to adjust the playback electronics to minimize or eliminate the phase distortion.

The embodiments of the invention in which an exclusive property or privilege is claimed are defined as follows:

1. In a magnetic recording/playback system, a method of detecting phase shift errors in the playback portion of said system, said method comprising:
    recording on a magnetic tape a square wave signal having a frequency of one-third of the bandedge frequency of the system;
    playing back the recorded signal through said playback portion to produce a resultant signal having a waveform representing the first and third harmonics of said recorded signal, said waveform having a first and second peak in each positive half cycle;
    extracting a time-averaged sample of the amplitude of each of said first and second peaks;
    comparing the magnitude of the two time-averaged signals; and
    producing a difference signal commensurate with and representative of said phase shift error.

2. The method as set forth in claim 1 wherein said extracting of time-averaged samples includes generating a first and second sample strobe signal coincident, respectively, with said first and second peaks, sampling the amplitude, respectively, of said first and second peaks, and filtering the sample to provide said time-averaged samples.

3. In a magnetic recording/playback system, apparatus for detecting phase shift errors in the playback portion of said system, said apparatus comprising:
    a magnetic tape;
    means for recording on said magnetic tape a square wave signal having a frequency of one-third of the knowledge frequency of the system;
    playback means for playing back the recorded square wave signal from said tape to produce a resultant signal having a waveform representing the first and third harmonics of said recorded signal, said waveform having a first and a second peak in each positive half cycle;
    sampling means connected for sampling the amplitude of each of said first and second peaks;
    time-averaging circuit means connected, respectively, to said sampling means for time-averaging the sampled values, respectively, of said first and second peaks;
    comparing means connected to said time-averaging circuit means for comparing the time-averaged samples of the amplitude of said first peaks with the time-averaged samples of the amplitude of said second peaks to produce a difference signal commensurate with and representative of said phase shift error.

4. Apparatus as set forth in claim 3 wherein said sampling means includes a sample strobe pulse generating means for generating a first and a second sample strobe pulse synchronized to be coincident with said first and second peaks, respectively, and first and second switch means connected between said playback means and said time-averaging circuit means, said first and second switch means being connected to be actuated, respectively, by said first and second sample strobe pulses.

5. Apparatus as set forth in claim 4 wherein said sampling means further includes a zero crossing detector having an input connected to said playback means to produce an output pulse coincident with each positive going crossing of the zero axis by resultant signal, said sample strobe pulse generating means being connected to be synchronized by said output pulse from said zero crossing detector.

6. Apparatus as set forth in claim 5 wherein said means for recording includes a clock signal generator for producing a high frequency clock signal and a frequency divider connected to said clock signal generator for producing said square wave signal to be recorded.

7. Apparatus as set forth in claim 6 wherein said sampling means includes a second frequency divider connected to said clock signal generator, said second frequency divider being connected to be synchronized by said output pulse from said zero crossing detector, said sample strobe generating means comprising a shift register connected to be clocked by output pulses from said second frequency divider.

8. Apparatus as set forth in claim 7 wherein said time-averaging circuit means includes a first and a second RC filter, each having a time constant many times larger than the period of said bandedge frequency, said comparing means including a differential amplifier having a first, non-inverting, input terminal and a second, inverting, input terminal, said first RC filter being connected between said first switch means and said first input terminal and said second RC filter being connected between said second switch means and said second input terminal.

* * * * *